United States Patent [19]

Murphy

[11] 4,442,938
[45] Apr. 17, 1984

[54] SOCKET TERMINAL POSITIONING METHOD AND CONSTRUCTION

[75] Inventor: James V. Murphy, Warwick, R.I.

[73] Assignee: Advanced Interconnections, Warwick, R.I.

[21] Appl. No.: 477,622

[22] Filed: Mar. 22, 1983

[51] Int. Cl.³ .................... B65D 73/02; B65D 85/24
[52] U.S. Cl. .................................. 206/329; 206/347; 206/443; 206/328
[58] Field of Search ............... 206/329, 328, 347, 820; 29/630 D, 626, 203

[56] References Cited

U.S. PATENT DOCUMENTS

| | | | |
|---|---|---|---|
| 3,097,360 | 7/1963 | Carlson, Jr. et al. | 206/347 |
| 3,545,606 | 12/1970 | Bennett et al. | 206/329 |
| 3,892,313 | 7/1975 | Lange | 206/347 |
| 4,099,615 | 7/1978 | Lemke et al. | 206/328 |

Primary Examiner—William T. Dixson, Jr.
Attorney, Agent, or Firm—Robert J. Doherty

[57] ABSTRACT

An improved method and construction for positioning a plurality of socket terminals on an electrical circuit board in a predetermined configuration prior to the solder connection thereto. A sheet of electrically insulative, flexible, resinous plastic material is provided with a plurality of holes in an array conforming to the desired positioning of the sockets on the circuit boards. The socket terminals are provided with an enlarged generally cylindrical head including an intermediate groove such that the heads extend into the holes and are adapted for frictional snap engagement with the sheet. The sheet with the array of sockets temporarily held thereby is positioned on the circuit board which is then conventionally soldered so as to electrically and mechanically fix the sockets to the board. Thereafter, the sheet may be removed. The enlarged head of the circuit terminal is provided with leading edge sheet contacting surface to enable the terminals to be push positioned into the holes without injuring the sheet.

14 Claims, 12 Drawing Figures

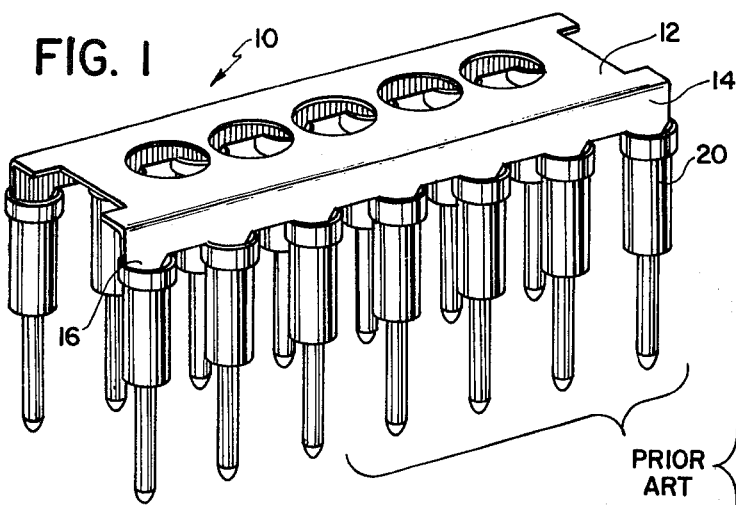
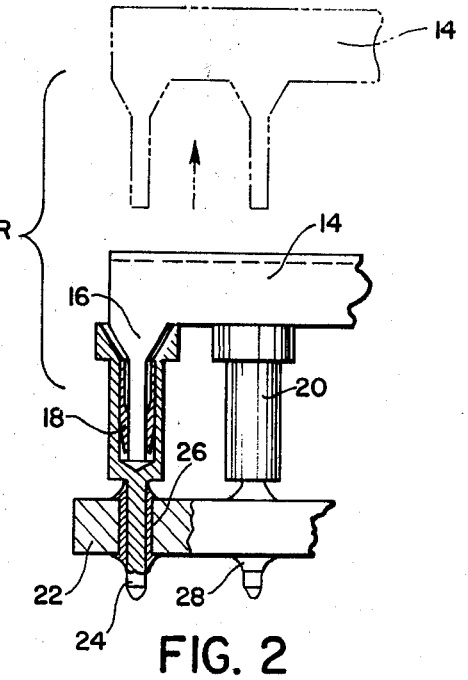
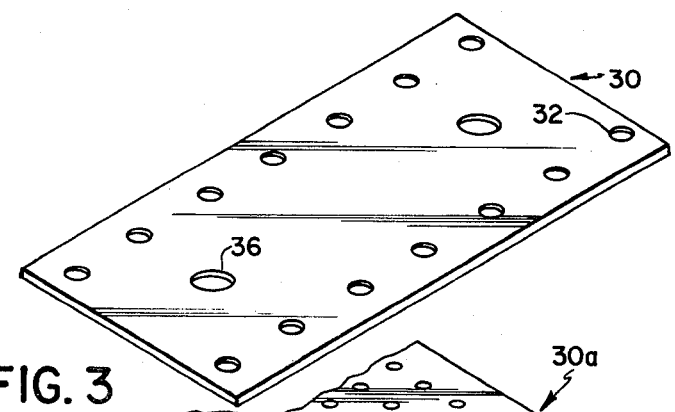
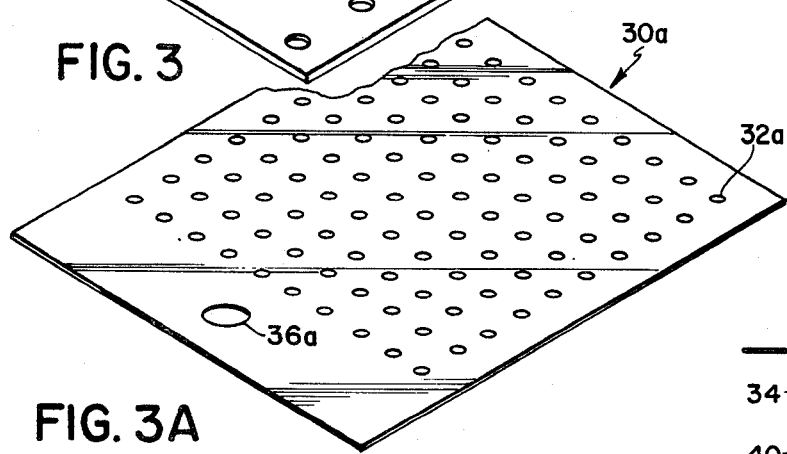
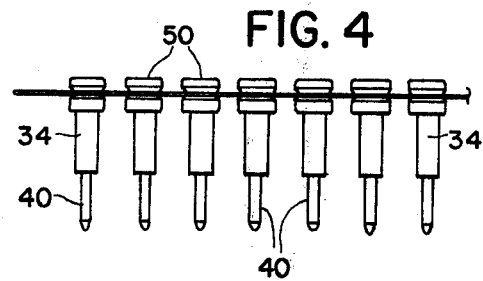
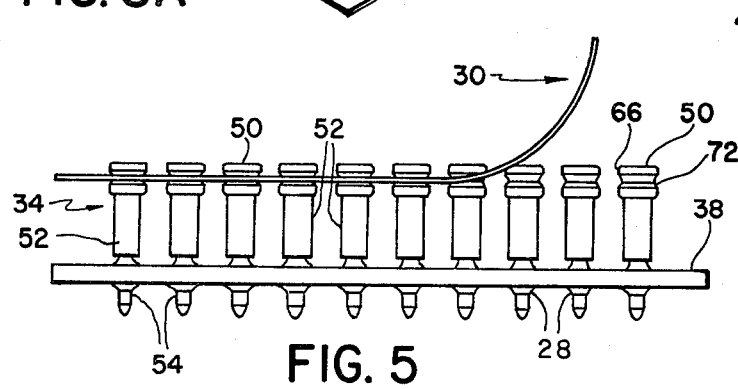
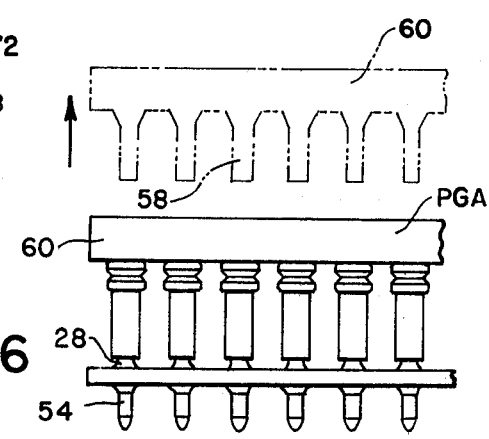

SOCKET TERMINAL POSITIONING METHOD AND CONSTRUCTION

BACKGROUND AND OBJECTS OF THE INVENTION

This invention deals with an improved construction and method of positioning a plurality of socket terminals on an electrical circuit board such as a printed circuit board having a plurality of openings into which the pin portions of the socket terminals can be hand assembled upon the circuit board in the desired position, such involves undue time consumption; and, accordingly, it is generally accepted practice to utilize socket terminal carrier assemblies for group insertion into the printed circuit board.

Such carrier assemblies are conventionally in the form of an aluminum plate having a plurality of downwardly extending thin fingers for entrance into the open sleeve portion of the socket terminals such that the terminals are held thereby and inserted into the PC board as a group in the desired array. Such system has found wide acceptance for socket terminals destined for single in-line and dual in-line positioning on circuit boards but are not particularly adapted with the recently introduced more complex pin grid arrays associated with electronic circuitry, i.e., integrated circuits. Thus it would be unwieldy to produce a conventional aluminum carrier having downwardly extending fingers in the desired number and geometric configuration necessary to group insert the number of socket terminals associated with such integrated circuit pin grid arrays. Accordingly, it would be desirable to be able to simply and effectively group position socket terminals in both simple and complex pin arrays by the same means.

Another problem associated with the use of presently utilized conventional socket terminal carrier assemblies such as the above-described aluminum plates is that there is both considerable tooling cost and lead time required to produce such carriers. Accordingly, a further desirable feature would be the provision of a means by which both lead time and tooling cost could be substantially reduced.

Still another problem associated with the use of aluminum carriers as above-described is that the slender fingers which are inserted into the lead socket can sometimes undesirably alter the electrical conductive properties of the sleeve portion of such sockets as by scratching or otherwise damaging the internal surface thereof. Such sleeves are very often provided with a very thin gold plate for contact of the pins of the active electrical or electronic circuit element and, accordingly, can be fragile and unnecessary contact therewith should be avoided. Also as when such aluminum carriers are carelessly removed, it is possible to actually pull out the contact sleeve of one or more sockets thus rendering the device useless. Accordingly, a further object of the present invention is the provision of a system and means whereby internal portions of the lead sockets are not contacted during the group insertion thereof into the printed circuit board.

It is also important that inspection of the soldered connections, particularly the connections between the upper portion of the printed board and the downwardly extending lead socket pin, not be obscured or otherwise hindered from proper inspection prior to the removal of the carrier element. Accordingly, a further object of the present invention is the provision of an improved system and means for group insertion of lead sockets which do not hinder solder inspection.

The above objectives as well as other objectives as will hereinafter be more apparent are achieved in the present invention by the provision of a construction for temporarily positioning a plurality of socket terminals on an electrical circuit board in a predetermined configuration prior to solder connection thereto, comprising a sheet of relatively thin, flexible, electrically insulative, resinous plastic material having a plurality of holes extending therethrough, said holes arranged in a planar configuration about said sheet to correspond with said predetermined positioning of said socket terminals in said circuit board, a plurality of socket terminals each having a pin adapted for insertion into an opening in said board at their lower end and an enlarged generally cylindrical head at their upper end, said enlarged head having upper and lower sections defined by an inwardly extending perimetal groove intermediate the height thereof and of a lateral extend less said upper and lower sections, said holes of a perimetal extent less than said head sections but generally corresponding to or slightly greater than that of said groove, said terminals adapted for positioning upon said sheet with the heads thereof extending through said holes and the sheet extending into said grooves and therein the leading edge of at least one of said upper and lower head sections is provided with a longitudinally oriented, sheet contacting surface to enable said terminals to be pushed positioned into said grooves.

Other objects, features and advantages of thhe invention shall become apparent as the description thereof proceeds when considered in connection with the accompanying illustrative drawings.

DESCRIPTION OF THE DRAWINGS

In the drawings which illustrate the best mode presently contemplated for carrying out the present invention:

FIG. 1 is a perspective view of a conventional aluminum lead socket carrier;

FIG. 2 is an elevational view partially in section showing the manner in which the carrier shown in FIG. 1 may be utilized to position lead sockets on a printed socket board;

FIG. 3 is a perspective view showing one form of the carrier sheet utilized in the present invention;

FIG. 3A is a perspective view similar to FIG. 3 showing another form (a pin grid array) of the carrier of the present invention;

FIG. 4 is a side elevational view of either of the carrier forms shown in FIGS. 3 or 3A;

FIG. 5 is an elevational view similar to FIG. 2 but showing the manner in which the carrier sheet of the present invention may be utilized;

FIG. 6 is an elevational view similar to FIG. 5 but showing the manner in which the active circuit component, i.e., a pin grid array of an integrated circuit, is assembled to the circuit board/lead socket carrier assembly;

DESCRIPTION OF THE INVENTION

Figure 7:
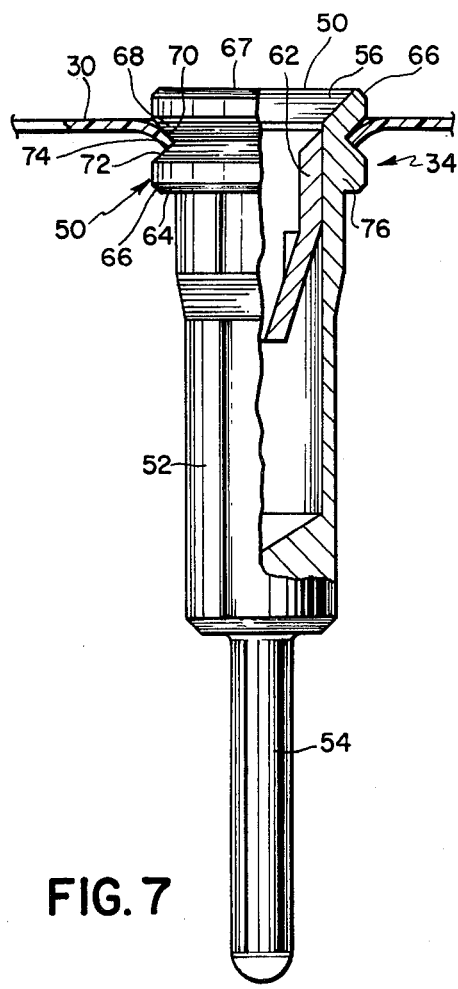
FIG. 7 is an enlarged sectional view showing the manner in which an individual lead socket pin is held by the carrier of the present invention.

Referring to the drawings and particularly FIGS. 1 and 2 thereof, the conventional prior art manner of positioning lead sockets onto a printed circuit board prior to the soldering thereto is depicted. Therein an aluminum carrier 10 having a generally planar body 12 with downwardly extending flanges 14 is shown. Such configuration is known as dual in-line. The carrier also is formed in a single line configuration as well. The flanges terminate in a plurality of thin fingers 16 which are adapted to extend internally and engage a contact sleeve 18 of a lead socket 20. The construction of such lead socket 20 may be as described in U.S. Pat. No. 4,236,776, the disclosure of which is herewith incorporated into the present specification by specific reference thereto. In addition, the aluminum carrier may be that described in Augat, Inc.'s catalog, Page No. DS28, copyright 1973, and a copy of which is attached to the specification and incorporated therein by specific reference thereto.

With the various lead sockets 20 carried by the fingers 16, the assembly as a group is positioned upon a printed circuit board 22 such that the downwardly extending terminal pin portions 24 of the sockets 20 extend into openings 26 in the printed circuit board. Such configuration is standard and shown not only by the above referred to Augat catalog page but also in U.S. Pat. No. 4,175,810, the disclosure of which is hereby incorporated into the present specification by specific reference thereto. Thereafter, the resultant assembly is wave soldered by conventional techniques so as to result in a solder fillet 28 bridging the openings 26 and both electrically and preferably mechanically attaching the plurality of lead sockets 20 to the printed circuit board 22 in the desired array. After inspecting the solder connections, the holder 10 is removed and, accordingly, the receiving sleeve contact portions of the lead sockets 20 available to receive an active electrical or electronic circuit in the intended manner.

As previously explained in the objects of the invention, such procedure is satisfactory for a single or a dual in-line configuration but does not lend itself to the more complex group lead socket configurations which are required for pin grid arrays such as required by active integrated circuit components. Accordingly and by reference to the remaining portions of the drawings, the carrier element 30 of the present invention may take the form of a dual in-line configuration such as shown in FIG. 3 of a more complex configuration suitable for an I.C. circuit pin grid array such as shown in FIG. 3A. Accordingly, the configuration shown in FIG. 3A involves the use of a far greater number of holes 32 disposed therethrough and adapted for the receipt of a lead socket 34 as will hereinafter be more fully brought out.

A preferred material for the carrier sheet 30 is 0.01 inch thick Mylar approximately 2.1 inches in length and 1.8 inches in width although any appropriate size, thickness, and material may be utilized so long as it exhibits the necessary flexibility, heat resistance at soldering temperatures, and electrical insulative properties. It is also preferable that the material be a resinous plastic for ease in forming, at least translucent and preferably clear such that the solder connections ultimately made in utilizing this sheet may be inspected with ease and printable such that instructions, directions, and the like may be applied to the upper surface thereof. Such sheet 30 is provided with a number of holes 32, preferably circular in configuration and each generally of the same diameter.

Such holes 32 are formed by conventional punching or drilling techniques and, accordingly, the use of such sheet in the intended manner as will hereinafter be brought out lends itself to short run or one-of-a-kind projects wherein it would not be generally economical to produce hard tooling that would otherwise be necessary for the construction of conventional aluminum carrier 10 such as depicted in FIGS. 1 and 2 of the drawings. In addition to the socket positioning holes 32, a number of other holes 36 of varying diameter and position may be provided so as to orient the carrier sheet 30 when loaded with the appropriate number of lead sockets 34 over a printed circuit board in the intended manner. The sheet shown in FIG. 3A is provided with any desired number of preferably distant spaced holes, i.e., 100 (ten to a side) or 196 (fourteen to a side), although any number as appropriate for use with pin grid arrays or conventional dual in-line configurations or single in-line configurations may be utilized.

It should also be pointed out that the carrier sheet 30 may be of more extensive planar dimension so as to enable, for example, an entire circuit board to be group inserted. That is, the sheet may be appropriately configured with holes and thus be loaded with the lead sockets from any practical number of individual arrays, be they single in-line, dual in-line, complex pin grid arrays, or combinations thereof.

The resultant sheet 30 is generally bottom supported in any desired manner as by a suitable jig and thereafter by conventional equipment or by hand and the appropriate number of lead sockets 34 snapped into place. Thereafter, the resultant carrier and socket assemblies such as shown in FIG. 4 is utilized to group position the sockets 34 into position on a printed circuit board 38 with the terminal pins 40 thereof extending through openings (not shown) in the circuit board 38. Thereafter, the resultant assembly shown in FIG. 5 is soldered such that the pins 40 and, accordingly, the sockets 34 are at least electrically and preferably mechanically as well attached to the printed circuit board 38. Any conventional soldering technique may be utilized so long as the temperature at which it is carried out is not detrimental to the material from which the carrier sheet 30 is made. Generally a wave soldering process which does not adversely effect Mylar is the preferred manner. In those cases where a different soldering technique is desired, e.g., vapor phase soldering, then a carrier sheet material with a higher temperature resistance may be utilized. Kapton, made by Dupont is a suitable material for use in vapor phase soldering.

Figure 5A:
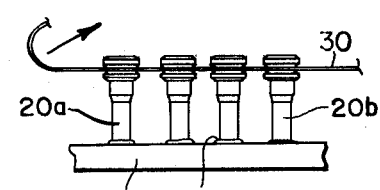
FIG. 5A is an elevational view similar to FIG. 5 but showing an alternate constructional form of socket which may be positioned on a PC board by the carrier sheet of the present invention.

Referring to FIG. 5A, it should be made clear that the carrier sheet can be advantageously used to group position sockets of varying constructions. For example, sockets 20a which are not pin inserted into openings in a circuit board but which are positioned above or in contact with the circuit board. An appropriate way to orient such sockets is by providing blank sockets 20b which may be glued to the board surface to orient the array. Suitable contact glues are commercially available for this purpose. Also orientation sockets with pins may be utilized in addition to or in combination with the above-described mounting technique.

After inspection of the solder fillets such as solder fillets similar to those shown in FIG. 2, which is facilitated by the observation ease brought out by the preferably clear or at least translucent nature of the carrier sheet 30, the sheet 30 may be removed. Thereafter, the pin grid array of an active electrical or electronic circuit is plugged into the resultant assembly in the intended manner. It is not completely necessary to remove the carrier sheet since such is not conductive and is otherwise generally harmless to the resultant structure. It is, however, normal that the sheet be progressively torn or peeled away from the enlarged headed portions of the sockets 34 after soldering and inspection.

Figure 7A:
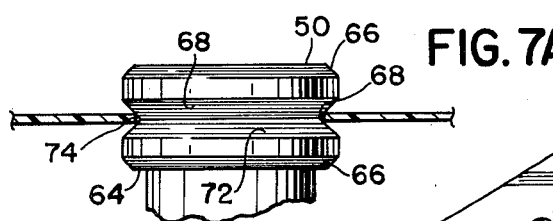
FIG. 7A is an enlarged partial sectional view showing an alternate manner by which the carrier may hold an individual lead socket pin.

Turning now to FIGS. 7 and 7A of the drawings, the particular configuration of the sockets 34 of the present invention will be described. Such sockets may internally conform to those conventional sockets described in the previous description of the prior art and differ primarily therefrom in the construction and inclusion of a generally cylindrical enlarged head 50. The external part of the pin 34 includes a body portion 52, the enlarged terminal upper head portion 50, and a lower terminal pin portion 54. The interior portion of the socket 34 includes an upper open end 56 into which pins (58) from a pin grid array 60 or other electrical or electronic unit may downwardly extend into contact with a prepositioned sleeve 62.

Such socket 34 as well as the sleeve may be formed from any appropriate material although it is common that the major portions of such be brass and that the sleeve 62 be provided with a gold coating to improve electrical contact. The leading lower surface 64 of the enlarged head 50 is provided with a generally longitudinally oriented sheet contacting surface 66 as in the form of the chamfer depicted. Preferably the upper leading edge 67 is also provided with such chamfered surface 66. It should be brought out that the chamfered surface 66 depicted may be otherwise configured such as in the form of a curve or the like so long as the intended purpose of gradually imparting frictional contact with those portions of the sheet defining the holes 32 is brought about. Thus in those cases where the sheet 32 is bottom supported and the pins inserted from the top, the sheet will come in initial contact with the lower chamfer 66 and in those cases where the top of the sheet supported and the pins inserted from below, then the sheet will contact the upper surface 66.

An inwardly extending groove 68 is positioned intermediate the enlarged head 50 and is generally of V-shaped configuration brought about by the convergence of an upper inwardly, downwardly extending wall 70 and a lower, inwardly, upwardly extending wall 72. The diameter of the openings 32 terminate in a circumferential edge surface 74. As shown in FIG. 7, the movement of the lower head section 76 towards and into the opening 32 will cause a slight downward extension or bending of the edge 74, i.e., a sort of slight wiping action such that the peripheral portions of the sheet 30 surrounding the hole 32 will be downwardly directed into contact with the lower wall 72 within the groove 68. Conversely, if the socket 34 is inserted in the opposite direction, the slight deformation of the sheet surrounding the openings 32 will be in the opposite direction and the terminal edge 74 thereof will abut the upper slanted wall surface 70.

Alternatively and as shown in FIG. 7A, the dimensions of the groove 68 and the openings 32 may be such that a lesser deflection is caused such that the terminal edge 74 merely extends into the groove 68. The important aspect is that the relative dimensions are such that the socket head 50 is securely grasped by the sheet 30 in the various holes 32 thereof such that they cannot easily dislodge therefrom during normal handling of the carrier and socket subassembly prior to insertion on the PC board. It is also possible to utilize groove and hole configurations which are non-circular so long as they are appropriately matched to facilitate the necessary firm connection between the two. It is, accordingly, anticipated that some useful functions such as rotational orientation of a socket in a particular manner with respect to the carrier sheet 30 and, accordingly, ultimately with respect to the circuit board can be achieved by the use of triangular, square, oblong, rectangular, etc. openings.

Figure 9:
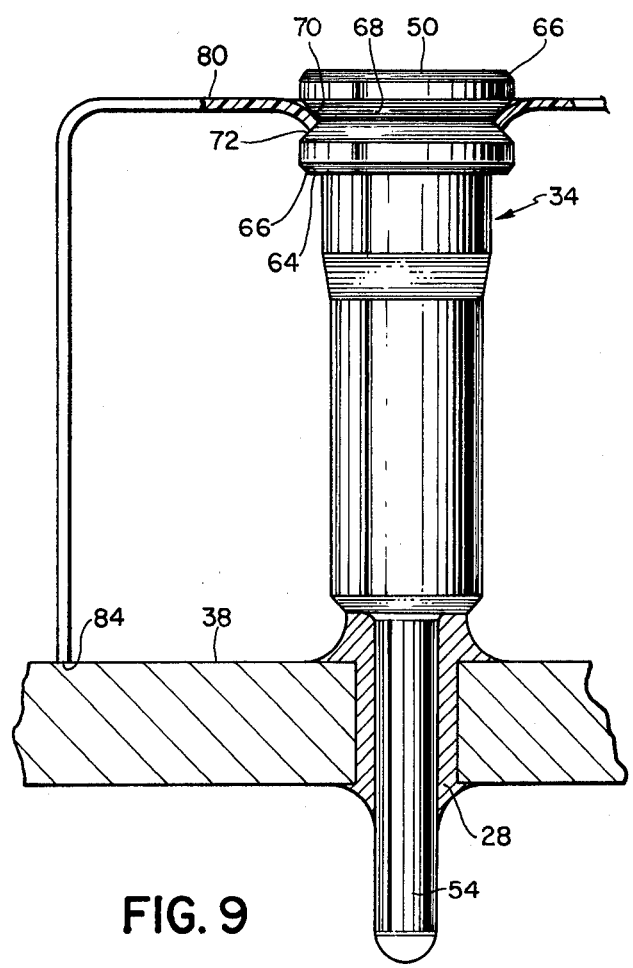
FIG. 9 is an elevational view partially in section showing the manner in which the carrier form shown in FIG. 8 is utilized.
Figure 8:
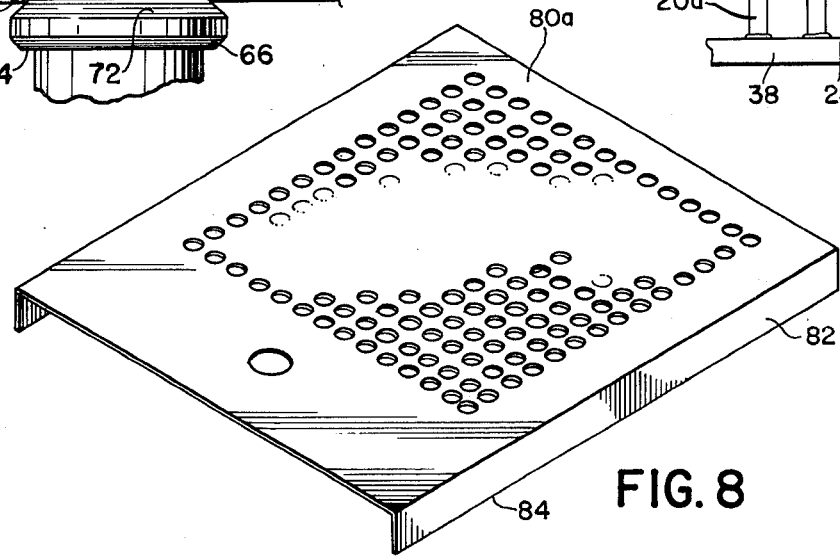
FIG. 8 is a modified form in which the carrier of the present invention may take.

Turning now to FIGS. 8 and 9 of the invention, a modified form of the carrier 30a is shown wherein the sides thereof include downwardly extending flanges 82 of a length such that the terminal surface or edges 84 thereof contact the upper surface of the PC board in such a manner as to hold the pin portions of the sockets slightly above the upper surface of the PC board so as to promote desirable solder filleting therebetween.

While there is shown and described herein certain specific structure embodying this invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. A construction for temporarily positioning a plurality of socket terminals on an electrical circuit board in a predetermined configuration prior to solder connection thereto, comprising a sheet of relatively thin, flexible, electrically insulative, resinous plastic material having a plurality of holes extending therethrough, said holes arranged in a planar configuration about said sheet to correspond with said predetermined positioning of said socket terminals in said circuit board, a plurality of socket terminals each having a pin adapted for insertion into an opening in said board at their lower end and an enlarged generally cylindrical head at their upper end, said enlarged head having upper and lower sections defined by an inwardly extending perimetal groove intermediate the height thereof and of a lateral extent less said upper and lower sections, said holes of a perimetal extent less than said head sections but generally corresponding to or slightly greater than that of said groove, said terminals adapted for positioning upon said sheet with the heads thereof extending through said holes and the sheet extending into said grooves and wherein the leading edge of at least one of said upper and lower head sections is provided with a longitudinally oriented, sheet contacting surface to enable said terminals to be push positioned into said grooves.

2. The invention of claim 1 wherein the geometric configuration of said holes corresponds with that of said grooves.

3. The invention of claim 2, said holes being circular.

4. The invention of claim 1, said head section sheet contacting surface being a circumferential chamfer.

5. The invention of claim 4, said chamfered surface provided on the lower portion of said lower head section.

6. The invention of claim 4, said chamfered surface provided on the upper portion of said upper head section.

7. The invention of claim 4, said chamfered surface provided on both the lower portion of said lower head section and the upper portion of said upper head section.

8. The invention of claim 1, said head section sheet contacting surface being provided on the leading edges of both said upper and lower head sections.

9. The invention of claim 1, said groove being of substantially V-shaped configuration.

10. The invention of claim 1, said sheet including downwardly extending edge flanges having terminal edge surfaces adaped to contact the upper surface of said circuit board so as to hold portions of said socket terminal pins above said board during soldering of said pins thereto.

11. The invention of claim 1, said sheet being substantially clear Mylar.

12. The method of group positioning a plurality of socket terminals on an electrical circuit board in a predetermined configuration prior to solder connections thereto, comprising forming a plurality of holes in a sheet of relatively thin, flexible, electrically insulative, resinous plastic material in an array at least including said predetermined configuration, each of said socket terminals having a head of enlarged, generally cylindrical configuration and having an inwardly extending perimetal groove intermediate the height thereof so as to define upper and lower sections of said head, said holes of a perimetal extent less than said head sections but generally corresponding to or slightly smaller than said intermediate groove, the leading edge of at least one of said head sections provided with a longitudinally oriented sheet contacting surface, supporting one surface of said sheet and thereafter inserting the the heads of a plurality of socket terminals from the opposite surface of said sheet into said holes in said predetermined configuration such that said longitudinally oriented surface initially contacts peripheral edge portions of said sheet defining said holes so as to slightly deform said edge portions in the direction of head insertion until said sheet edge portions snap into said groove.

13. The method of claim 12 wherein said sockets are inserted into said holes head first.

14. The method of claim 12 wherein said sockets are inserted into said holes head last.

* * * * *